United States Patent [19]

Thurber, Jr.

[11] Patent Number: 4,656,459
[45] Date of Patent: Apr. 7, 1987

[54] DUAL SLOPE CONVERTER WITH LARGE APPARENT INTEGRATOR SWING

[75] Inventor: Charles R. Thurber, Jr., Sunnyvale, Calif.

[73] Assignee: Intersil, Inc., Cupertino, Calif.

[21] Appl. No.: 785,881

[22] Filed: Oct. 7, 1985

[51] Int. Cl.$^4$ .................................... H03M 1/50
[52] U.S. Cl. ...................... 340/347 NT; 324/99 D; 340/347 AD; 340/347 CC; 364/483
[58] Field of Search .... 340/347 NT, 347 M, 347 CC; 324/99 D; 364/575, 483

[56] References Cited

U.S. PATENT DOCUMENTS 3,316,547  4/1967  Ammann .
3,879,724  4/1975  McDonald .................. 340/347 M X
4,556,867  12/1985  George ......................... 340/347 NT

OTHER PUBLICATIONS

The Engineering Staff of Analog Devices, Inc., Analog–Digital Conversion Handbook, 6/1972, pp. II-48 to II-51.
Mitchell et al., Data Averager for Panel Meter Operates from Meter's Clock, Electronics, V. 46, No. 9, Apr. 26, 1973, p. 103.
"Numerical-Integration Techniques Speed Dual-Slope A/D Conversion" by Gary Grandbois and Wes Freeman, 147–154 EDN, Oct. 31, 1984.
"A Charge-Balancing Monolithic A/D Converter" George F. Landsburg, I.E.E.E. J. Solid–State Circuits, 662–673, Dec. 1977.
"Quantized Feedback Takes its Place in Analog-to-Digital Conversion" by Gary Grandbois and Ted Pickerell, Electronics, 10-13-77, 103–107.
Intersil Data Sheets: "A017 3, the Integrating A/D Converter"; ICL 7129, 4½ Digit Single-Chip A/D Converter.

Primary Examiner—T. J. Sloyan
Attorney, Agent, or Firm—Stanley C. Corwin; Mark Mollon

[57] ABSTRACT

Conversion is achieved by subdividing the intergrate and deintegrate periods into a plurality of integrate and deintegrate phases. Power frequency rejection can be maintained by defining the combined integrate phases to integrate over at least one complete power line cycle. Sychronization of the integrate phases with the power line cycle is maintained by separating integrate phases with a combined deintegrate and rest phase of fixed duration.

16 Claims, 5 Drawing Figures

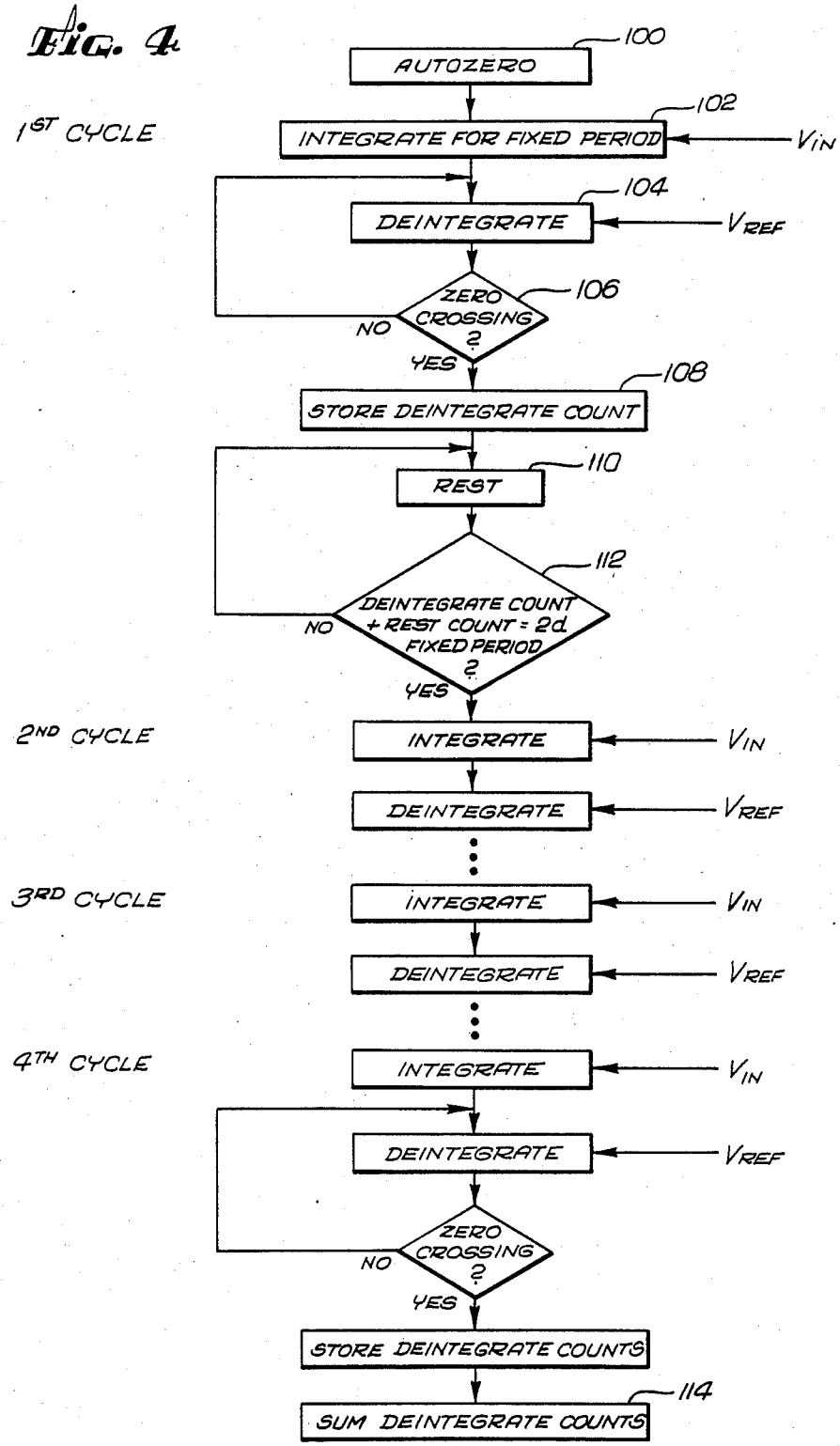

DUAL SLOPE CONVERTER WITH LARGE APPARENT INTEGRATOR SWING

BACKGROUND OF THE INVENTION

1. Field of the Invention.

The present invention relates to analog to digital converters, and more particularly, to dual slope analog to digital converters.

2. Discussion of the Background of the Invention.

Analog to digital converters convert an unknown analog input signal, such as an unknown voltage signal, to a digital representation of that unknown signal. Dual slope A/D converters typically include an integrator which integrates the unknown voltage over a fixed period of time which is usually referred to as the integrate cycle. During a subsequent deintegrate or timing cycle, the integrated signal is deintegrated by a known reference voltage for a variable period of time which is terminated when the deintegrated signal as sensed by a comparator reaches a predetermined level which is usually zero volts. The duration of the deintegrate cycle is proportional to the analog input voltage since the ratio of the input voltage to the reference voltage is equal to the ratio of the deintegrate cycle to the integrate cycle. The duration of the deintegrate cycle can be measured by counting clock pulses, which provides a digital representation of the analog input voltage.

One limitation on the rate at which many dual slope A/D converters can convert an analog input voltage to a digital representation is the finite response time of the comparator which detects the zero crossing of the deintegrated signal. The comparator response time is in turn related to a factor often referred to as the system "overdrive" which is the maximum voltage that the integrator can charge up to divided by the system resolution. Generally, the larger the system overdrive, the faster the comparator can correctly detect a zero crossing of the deintegrated signal. However, the maximum integrator voltage is typically limited by the power supply voltage of the system. Accordingly, in order to increase the response time of the comparator, it is often been necessary for many previous dual slope A/D converters to increase the supply voltage to the integrator of the converter system. Increasing the power supply voltage can increase power consumption as well as further complicate the design of the overall system.

Other techniques for improving the comparator response time (or decreasing the sensitivity of the system to this response time) have included adding external components or precisely matching certain elements. Such techniques can similarly increase design complexity and increase the costs of manufacture as well.

SUMMARY OF THE INVENTION

It is an object of the present invention to provide an improved dual slope A/D converter in which the comparator response time is improved without increasing power supply voltage.

It is a further object of the present invention to enable a reduction in power supply voltages of dual slope A/D converters without adversely affecting the conversion speed.

It is another object of the present invention to provide an improved dual slope A/D converter in which the required gain bandwidth product of the converter comparator can be relaxed without increasing the power supply voltage.

These and other objects and advantages are achieved in a dual slope A/D converter having an increased apparent integrator voltage swing. This is achieved by dividing the integrate and deintegrate cycles into a plurality of interleaved integrate phases and deintegrate phases. In one aspect of the present invention, each integrate phase is less than a full power line cycle with the total duration of the combined integrate phases of a conversion cycle equaling an integral multiple of the full power line cycle. As a result, power line noise rejection or normal mode rejection is maintained while increasing the apparent integrator voltage swing in accordance with the number of integrate phases.

In another aspect of the present invention, a rest phase is interposed between the termination of each deintegrate phase and the beginning of the next integrate phase, during which the integrator output remains constant. As a result, the residual signal level at the termination of the previous deintegrate phase provides the starting point for the next integrate phase. Consequently, information represented by the residual signal is not lost between phases.

BRIEF DESCRIPTION OF THE DRAWINGS

FIG. 4 is a flow chart illustrating the operation of the multicycle control circuit of FIG. 1.

DETAILED DESCRIPTION OF THE DRAWINGS

Figure 1:
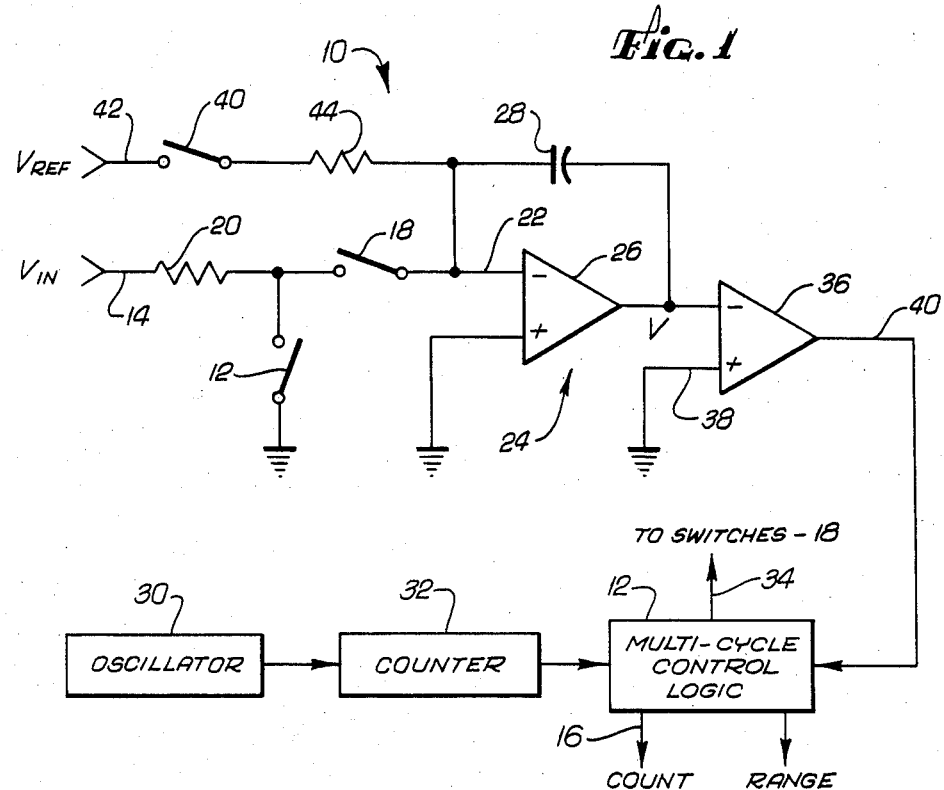
FIG. 1 is a schematic block diagram of a dual slope A/D converter in accordance with a preferred embodiment of the present invention.

Referring first to FIG. 1, a schematic diagram of an analog to digital (A/D) converter in accordance with a preferred embodiment of the present invention is indicated generally at 10. The converter 10 includes a novel multicycle control logic 12 which controls the overall operation of the converter 10.

An unknown analog input signal designated $V_{IN}$ is applied to an input 14 and is converted to a digital representation in the form of a digital count at an output 16 of the control logic 12. A switch 18 when closed (and switches 12 and 40 open), couples the input signal $V_{IN}$ via an input resistor 20 to the inverting input 22 of an integrator circuit 24 which includes an amplifier 26 and a feedback capacitor 28. The integrator circuit 24 integrates the input signal $V_{IN}$ for a predetermined period of time as measured by the control logic 12. Upon the expiration of the predetermined period, the multicycle control logic 12 opens the input switch 18. As will be more fully discussed below, the multicycle control logic 12 operates the converter circuit 10 in a manner which increases the apparent voltage swing of the integrator 24.

The predetermined integration period is measured by an oscillator 30 which provides a train of clock pulses at a fixed frequency to a counter circuit 32. When the counter circuit 32 reaches a count which corresponds to the expiration of the predetermined period, the control logic 12 opens the input switch 18 via a control line represented by the output 34 of the control logic 12.

As is well known, the magnitude of the integrated output signal V of the integrator 24 at the end of the predetermined integration period is proportional to the magnitude of the input signal $V_{IN}$. To measure the magnitude of the integrated signal V, the signal V is "deintegrated" by discharging the integration capacitor 28 at a known rate until the output V of the integrator 24 reaches a predetermined value as sensed by a comparator 36. The duration of this "deintegration" period is proportional to the magnitude of the integrator output V at the end of the integration period, and hence, is also proportional to the magnitude of the input signal $V_{IN}$.

The duration of the deintegration period may be measured digitally by counting clock pulses from the oscillator 30 with the counter circuit 32. Once the comparator circuit 36 determines that the integrator output V has reached the predetermined value (usually zero volts or ground), the output 40 of the comparator 36 changes state. The control logic 12 in response to the output of the comparator 36, reads the counter circuit 32.

The integrating capacitor 28 is discharged at the known rate by closing an input switch 40 which couples a known voltage $V_{REF}$ at a reference input 42 to the integrating capacitor 28 via an input resistor 44. Switch 18 is open and switch 12 is closed. The polarity of the reference voltage $V_{REF}$ is selected to be opposite to that of the input voltage $V_{IN}$ so that the integration capacitor 28 is discharged during the deintegration period.

Unlike many dual slope analog to digital converters of prior art, the converter 10 does not complete the conversion cycle with a single integrate-deintegrate cycle. Instead, the multicycle control logic 12 causes the converter 10 to repeat the integrate-deintegrate cycle a plurality of times, summing the count of the counter circuit 32 at the end of each deintegrate period. In this manner, the integrate and deintegrate periods are subdivided into a number of integrate and deintegrate phases, respectively.

It has been found that operating the converter circuit 10 in such a manner can increase the apparent voltage swing of the integrator output V which can improve the response time of the comparator 36. Furthermore, this may be accomplished while maintaining power line frequency or normal mode rejection. This may be better understood by referring to FIG. 2 which shows the operation of a typical dual slope A/D converter of the prior art. As shown therein, after first autozeroing the integrator amplifier to eliminate offset voltages, an input signal $V_{IN}$ is integrated during an integrate period of a fixed duration which is set to equal one (or more) power line cycles. At a power line frequency of 60 hertz, a typical integrate period is 1/60th of a second or approximately 1,000 counts for a commonly used clock frequency. By integrating over a full power line cycle, it is seen that the contribution to the integrated signal by power line noise can be substantially nulled.

Figure 2:
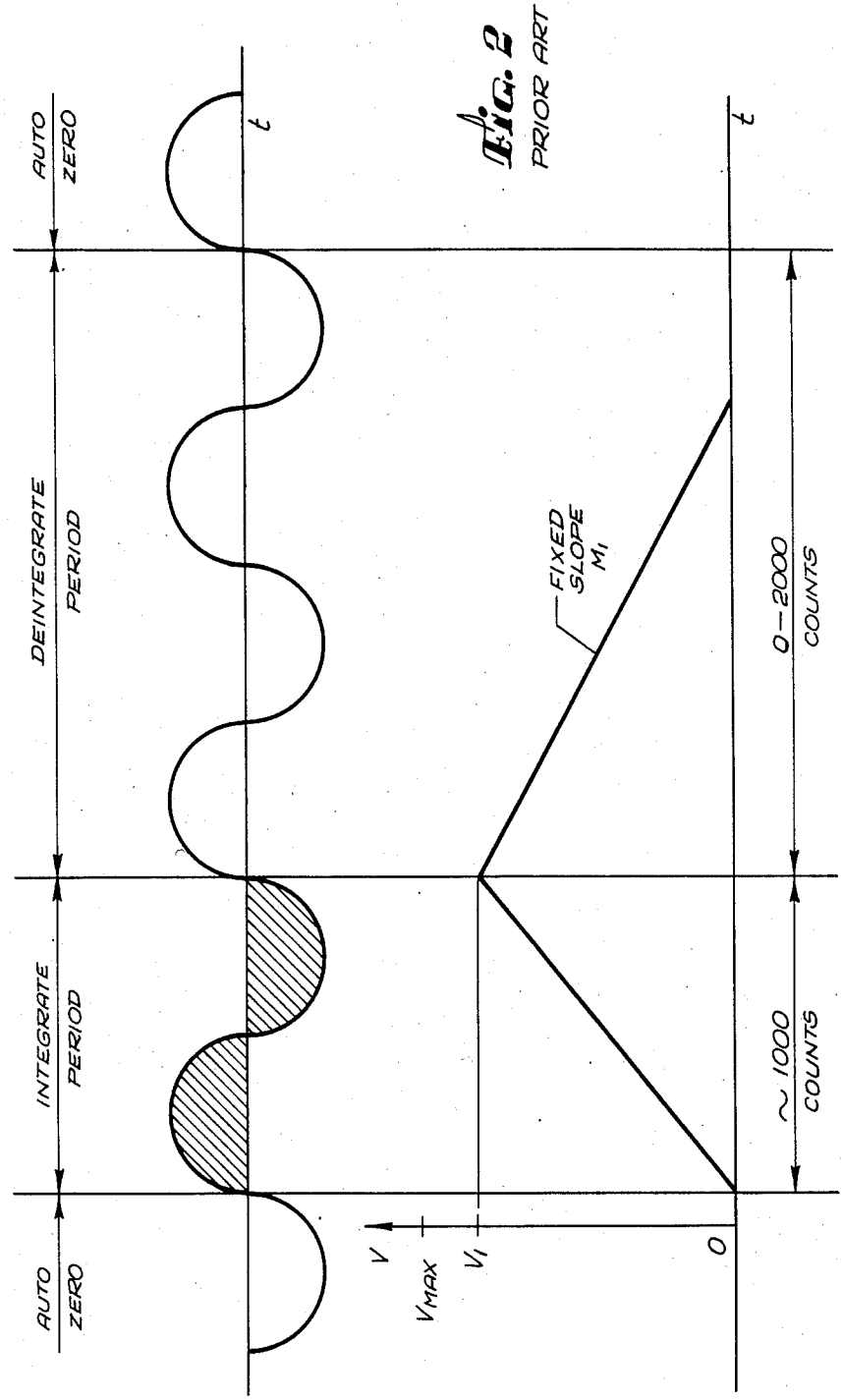
FIG. 2 is a timing diagram illustrating the operation of a typical prior art dual slope A/D converter.

At the end of the integrate period, the integrated signal has reached a value of $V_1$ as indicated in FIG. 2. The integrated signal is then deintegrated by discharging the integration capacitor at a known rate (slope $M_1$) for a variable period of time of zero to (typically) 2,000 counts. The total number of counts during the deintegrate period provides a digital representation of the input signal $V_{IN}$.

The conversion rate of a dual slope analog to digital converter may be increased by decreasing the number of counts during the integrate period and hence during the deintegrate period as well. However, such an approach also reduces the resolution and therefore the accuracy of the conversion. Another approach is to increase the clock frequency of the system oscillator which decreases the duration of the integrate and deintegrate periods while maintaining the resolution of the conversion. However, an inherent limitation on the clock frequency is the response time of the converter comparator. The period of each clock pulse generally should be greater than the response time of the comparator to avoid inaccurate results.

The comparator response time is a function of the "overdrive" of the system which is defined as the maximum integrator output voltage swing, $V_{max}$, divided by the maximum number of counts during the deintegrate period. In other words, the faster the integrator output changes, the faster the comparator will, in general, change as well.

The maximum integrator voltage $V_{max}$ is typically no larger than the power supply voltage since the integrator usually saturates before the power supply voltage can be exceeded. Thus, in order to improve the comparator response time, one approach has been to increase the power supply voltage or to decrease the sensitivity of the converter to the comparator response time. These latter techniques have typically required additional external components or precisely matched elements which can complicate and make more expensive the design and manufacture of the converter.

Figure 3:
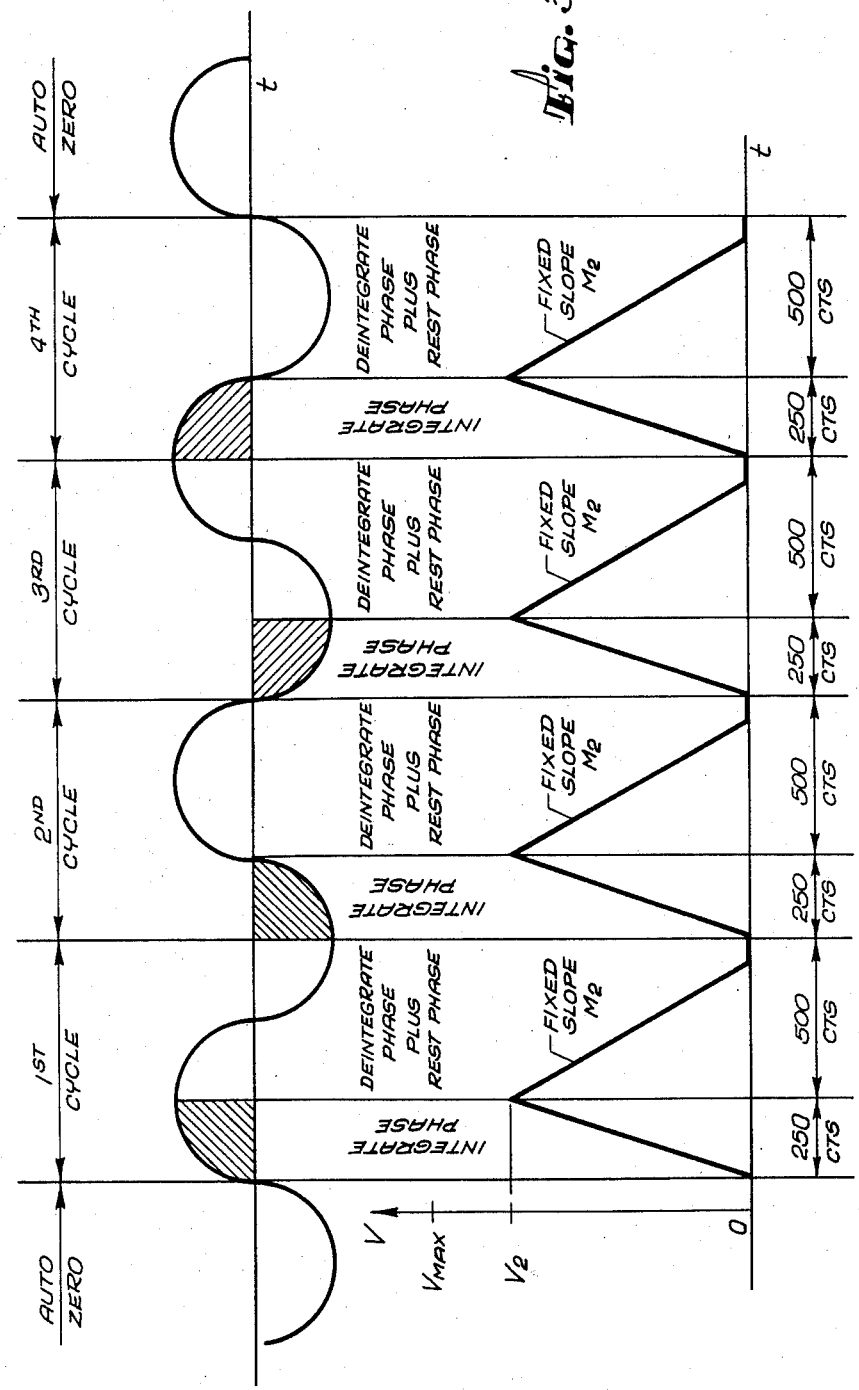
FIG. 3 is a timing diagram illustrating the operation of the dual slope converter of FIG. 1.

In accordance with the present invention, the apparent voltage swing of the integrator 24 has been increased without increasing the level of the power supply. This has been accomplished by, in the illustrated embodiment, subdividing the integrate period into four integrate phases as shown in FIG. 3. Similarly, the deintegrate period has been subdivided into four deintegrate phases. To each deintegrate phase has been added a "rest" phase of variable duration so that the combined duration of each deintegrate phase and rest phase pair is of fixed duration. As shown in FIG. 3, the deintegrate and rest phase pairs are interleaved with the integrate phases of the total conversion cycle.

In the illustrated embodiment, each integrate phase is one fourth of the total integrate period (1,000 counts) or 250 counts each. Each deintegrate phase plus rest phase is one half of the power line cycle, or 500 counts. Because the integration and deintegration periods have been subdivided into shorter phases, the integrator circuit 24 can integrate and deintegrate at faster rates without exceeding the maximum voltage $V_{max}$ at which saturation occurs. One manner in which a faster rate may be achieved is by utilizing a smaller integrator capacitor. By dividing the integration period into four phases, the capacitance of the integrator capacitor can be reduced by as much as one-fourth without the voltage $V_2$ (the voltage to which the integrator integrates to at the end of the first integrate phase) exceeding the corresponding voltage $V_1$ of the prior art circuit of FIG. 1 for a given input voltage $V_{IN}$. Consequently, the deintegration slope $M_2$ can be four times steeper as compared to the slope $M_1$ of the deintegration period of FIG. 2. As a result, the integrator overdrive has been increased by a factor of four thereby increasing the apparent voltage swing and the response time of the comparator.

Furthermore, although each integrate phase is only one fourth of a power line cycle, the four integrate phases of the total conversion cycle cover a complete power line cycle to maintain power frequency rejection. As previously mentioned, each integrate phase of the illustrated embodiment is one fourth of a power line cycle and each deintegrate phase plus rest phase is one half of a power line cycle. Thus, for a 60 hertz power frequency, the integrate phase and the combined deintegrate and rest phases are 1/240th and 1/120th of a second, respectively. However, it is recognized that the power line cycle may be subdivided into any number of phases. However, subdivision by a multiple of two can maintain power frequency rejection. In addition, the total integrate period may cover more than one complete power line cycle but a single power line cycle is preferred for higher speed operation.

A flow chart representing the operation of the multicycle control logic 12 is set forth in FIG. 4. A conversion cycle is initiated by an autozero cycle as indicated by block 100. During this autozero cycle, offset voltages of the amplifier 26 are compensated. The autozero cycle is followed by the first integrate phase of the first integrate-deintegrate cycle as indicated at block 102. In the illustrated embodiment, the beginning of the first integrate phase is timed to coincide with the positive going zero crossing of the power cycle as shown in FIG. 3. At that time, the multicycle control logic 12 (FIG. 1) closes the input switch 18 with input switches 12 and 40 open, which allows the integrator circuit 24 to integrate the input signal $V_{IN}$ for the first fixed period of 250 counts. The integrate cycle may start at other points of the power cycle. When the 250 counts are reached, the multicycle control logic 12 opens the input switch 18 which stops the integration of the input signal $V_{IN}$. At that time, the output V of the integrator circuit 24 has reached the voltage $V_2$ as shown in FIG. 3.

The multicycle control logic 12 then closes the input switch 40 to deintegrate the integrated signal on the integration capacitor 28 as indicated at block 104. During the deintegration, the integration capacitor 28 is discharged at a predetermined rate as set by the magnitude of the reference voltage $V_{REF}$, the capacitance of the integration capacitor 28, and the value of resistor 44. As previously mentioned, the integration capacitor 28 may have a significantly smaller capacitance to sharply increase the integration and deintegration rates without saturating the integrator 24.

As indicated by decision block 106, deintegration continues until the integrator output V reaches zero volts as detected by the comparator 36. Once the integrator output V crosses zero, the multicycle control logic 12 opens the input switch 40 to terminate deintegration on the trailing edge of the clock pulse. In addition, the multicycle control logic 12 reads the counter 32 to determine the number of counts during the first deintegrate phase.

Figure 5:
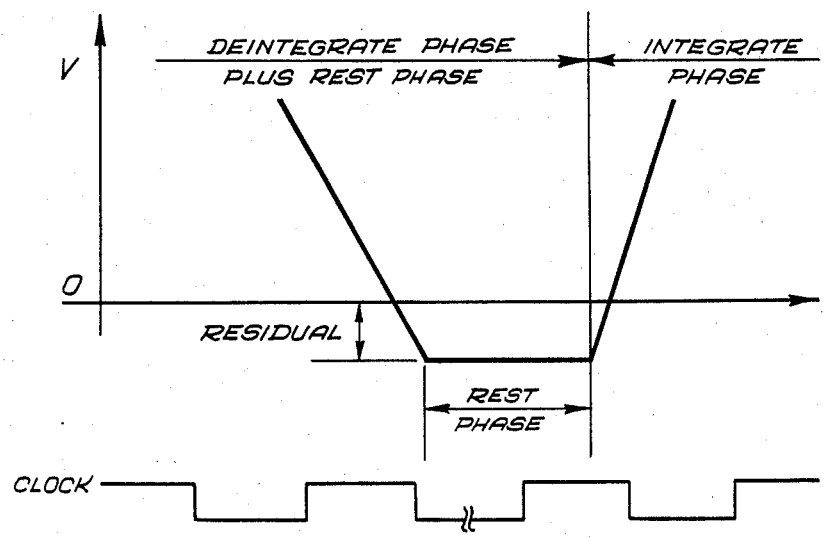
FIG. 5 is an enlarged portion of the timing diagram of FIG. 3.

Because the termination of the clock pulse usually does not coincide with the zero crossing of the integrator output, deintegration usually continues past the zero crossing until the clock pulse terminates as the enlarged view in FIG. 5 shows. The residual signal past the zero crossing represents the error resulting from the finite resolution of the system. In order to correct for this error, the magnitude of the comparator output V at the termination of the deintegrate phase is maintained constant during the rest phase as illustrated in FIG. 5 and represented by block 110 of FIG. 4. In this manner, the integrator output at the end of the deintegrate phase provides the starting point for the subsequent integrate phase.

In the illustrated embodiment, the integrator output V is held constant during the rest phase by integrating "zero" volts during the rest phase. That is, switches 40 and 18 are open and switch 12 is closed during its rest phase.

In order to synchronize the integrate phases with the power line cycles, the combined duration of the deintegrate and rest phases is set to a predetermined constant, which in the illustrated embodiment, is one half power cycle or 500 counts. When the counter 32 reaches the predetermined count as represented in decision block 112, the multicycle control logic 12 begins the second integrate-deintegrate cycle as shown in FIGS. 3 and 4. The second integrate-deintegrate cycle is like the first except that the integrator output V starts at the value attained at the end of the previous deintegrate phase rather than the zero volts starting point of the first integrate-deintegrate cycle. The third and fourth integrate-deintegrate cycles operate similarly.

After the end of the fourth integrate-deintegrate cycle, the multicycle control logic 12 sums the deintegrate counts from each integrate-deintegrate cycle as represented in block 114 of FIG. 4. The combined total of deintegrate counts will range from 0 to 2000 counts in the illustrated embodiment, and will provide a digital representation of the analog input signal $V_{IN}$.

The multicycle control logic 12 also controls any range switching of the converter 10. The logic for such is conventional and need not be more fully explained here.

It is seen from the above that the present invention provides a dual slope A/D converter which can have an apparent voltage swing which is larger than the power supply of the system. This larger apparent voltage swing may be utilized to increase comparator response time, reduce power supply voltage or relax gain/bandwidth product requirements, without reducing the converter conversion speed. It is recognized that modifications of the illustrated embodiment of the present invention are possible, some being apparent after study and others being matters of routine electronic design. As such, the scope of the present invention should not be limited to the embodiment hereindescribed but should be defined only by the appended claims and equivalents thereof.

I claim:

1. In an integrating analog to digital converter of the type in which an integrator is charged to a level established by an unknown input signal during an integrate phase of fixed time and is then deintengrated during a deintegrate phase until the integrator output reaches a predetermined level, wherein the deintegration phase is measured by clock pulses occurring at predetermined intervals, the improvement wherein the duration of the fixed integration phase is less than one full power cycle period and the converter further comprises means for holding the integrator output constant at the end of the deintegrate phase to define a rest phase until the beginning of a subsequent integrate phase, and means for repeating the integrate and subsequent deintegrate and rest phases until the total duration of the integrate phases is equal to an integral multiple of the power line cycle, the integrate phases being timed to occur at various portions of the power line cycle to reject power line noise.

2. The converter of claim 1 wherein the total duration of the integrate phases is 1/60th of a second.

3. The converter of claim 1 wherein the power line period is 1/60th of a second.

4. The converter of claim 1 wherein the duration of each fixed integrate phase is equal to one full power line cycle divided by a factor equal to a power of two.

5. The converter of claim 4 wherein the total duration of each combined deintegrate phase and rest phase is equal to an integral multiple of the integrate phase.

6. The converter of claim 1 wherein the duration of the integrate phase is 1/240th of a second and the duration of each combined deintegrate phase and rest phase is 1/120th of a second.

7. A method for converting an analog signal to a digital value, comprising the steps of:
(1) integrating an analog signal for a predetermined period of time which is less than one full power line cycle;
(2) deintegrating the integrated signal at a known rate until it reaches a predetermined level;
(3) digitally measuring the period of time required for the integrated signal to deintegrate to the predetermined level;
(4) holding the deintegrated signal at the value attained at the end of the deintegrator steps so that the subsequent integrating step occurs at a different portion of the power line cycle;
(5) repeating steps 1-5 until the total periods of times of integration equal an integral multiple of one full power line cycle; and
(6) arithmetically combining the digitally measured periods of time of deintegration to provide a combined digital value which is proportional to the analog signal.

8. An integrating analog to digital converter for converting an unknown analog signal to a digital value, comprising:
an integrator for integrating the analog signal;
detection means for detecting when the output of the integrator reaches a predetermined value; and
control means responsive to the detection means for operating the integrator in multiple cycles in which each cycle comprises an integrate phase of a fixed duration which is less than one full power line cycle, and a deintegrate phase and a rest phase, the combined durations of which are equal to an integral multiple of the duration of the integrate phase, wherein the control means comprises means for;
(1) causing the integrator to integrate the analog signal for the predetermined duration of the integrate phase,
(2) causing the integrator to deintegrate the integrated signal during the deintegration phase until the integrated signal reaches a predetermined level, marking the termination of the deintegrate phase,
(3) causing the output of the integrator to remain constant during the rest phase until the combined duration of the deintegrate phase and the rest phase are equal to said multiple of the integrate phase so that the subsequent integrating step occurs at a different portion of the power line cycle, and
(4) repeating each cycle of an integrate phase, a deintegrate phase and a rest phase until the combined durations of the integrate phases correspond to each portion of an integral multiple of the power line cycle.

9. The converter of claim 8 wherein the integral multiple of the power line cycle in a single power line cycle.

10. In an integrating analog to digital converter of the type in which an integrator is charged to a level established by an unknown input signal during an integrate phase of a predetermined number of clock pulses and is then deintegrated during a deintegrate phase until the integrator output reaches a predetermined level as determinined by a comparator, said integrator output overshooting the predetermined level to a residual level, wherein the deintegrate phase is measured by counting clock pulses, the improvement wherein the converter further comprises means for holding the integrator output at the residual level upon termination of the deintegrate phase and during a rest phase and until the initiation of a subsequent integrator phase at a different portion of the power line cycle, and means for repeating the integrate, deintegrate and rest phases until the total duration of the integrate phases is equal to second predetermined number of clock pulses;
wherein the total number of clock pulses during the deintegrate phase is a digital representation of the unknown input signal.

11. The converter of claim 10 wherein the total duration of the second predetermined number of clock pulses of the integrate phases is equal to an integral multiple of the power line cycle.

12. The converter of claim 10 wherein the total duration of the second predetermined number of clock pulses of the integration phases is 1/60th of a second.

13. The converter of claim 10 wherein the total duration of the first predetermined number of clock pulses of the integrate phase is equal to one full power line cycle divided by a factor equal to a power of two.

14. The converter of claim 13 wherein the total duration of each combined deintegrate phase and rest phase is equal to an integral multiple of the integrate phase.

15. The converter of claim 10 wherein the duration of each integrate phase is 1/240th of a second and the combined duration of each deintegrate phase and subsesquent rest phase is 1/120th of a second.

16. A method for converting an analog signal to a digital value, comprising the steps of:
(1) integrating an analog signal for a predetermined period of time which is less than one full power line cycle;
(2) deintegrating the integrated signal at a known rate;
(3) terminating deintegration of the integrated signal at a residual level after the deintegrated signal reaches a predetermined level;
(4) digitally measuring the period of time required for the integrated signal to deintegrate to the residual level;
(5) holding the deintegrated signal at the residual level until the initiation of a subsequent integration of the analog signal at a different portion of the power line cycle;
(6) repeating steps (1)-(5) until the total periods of times of integration equal a second predetermined period; and
(7) arithmetically combining the digitally measured periods of time to provide a combined digital value which is proportional to the analog signal.

* * * * *